US007274719B2

United States Patent
Bour et al.

(10) Patent No.: US 7,274,719 B2
(45) Date of Patent: Sep. 25, 2007

(54) BURIED HETEROSTRUCTURE QUANTUM CASCADE LASER

(75) Inventors: David P. Bour, Cupertino, CA (US); Scott W Corzine, Sunnyvale, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 197 days.

(21) Appl. No.: 11/076,599

(22) Filed: Mar. 9, 2005

(65) Prior Publication Data

US 2006/0203865 A1 Sep. 14, 2006

(51) Int. Cl.
*H01S 5/00* (2006.01)
(52) U.S. Cl. .................. 372/45.01; 372/46.01
(58) Field of Classification Search ........... 372/45.01, 372/46.01
See application file for complete search history.

(56) References Cited

U.S. PATENT DOCUMENTS

| 6,055,257 | A | * | 4/2000 | Baillargeon et al. | ..... 372/46.01 |
| 6,470,039 | B1 | * | 10/2002 | Ukita | ............. 372/46.01 |
| 6,665,325 | B2 | | 12/2003 | Beck et al. | |
| 2002/0136252 | A1 | | 9/2002 | Capasso et al. | |

FOREIGN PATENT DOCUMENTS

| WO | WO98/40916 | 9/1998 |
| WO | WO 03/049243 | 6/2003 |
| WO | WO 03/049243 A2 * | 6/2003 |

OTHER PUBLICATIONS

International Search Report dated Jun. 5, 2006.

\* cited by examiner

*Primary Examiner*—Armando Rodriguez

(57) ABSTRACT

A buried heterostructure quantum cascade laser structure uses reverse biased junction to achieve current blocking. Doping and ridge width of the structure may be adjusted to provide effective mode discrimination.

20 Claims, 4 Drawing Sheets

BURIED HETEROSTRUCTURE QUANTUM CASCADE LASER

BACKGROUND

Typical lateral-guiding structures used to form single-mode waveguides for quantum cascade lasers are deep-etched ridge waveguides, shallow-etched ridge waveguides or deep buried heterostructure (BH) waveguides. For high power applications, BH waveguides are typically favored due to a better capacity to dissipate heat when in operation because of the high thermal conductivity of the InP burying layers.

FIG. 1 shows a prior art BH structure. Quantum cascade laser (QCL) structure 100 has top electrode 105 and bottom electrode 110 sandwiching n-InP layer 103 and n-InP layer 102. Quantum cascade (QC) active region 108 is located between n-InP layer 103 and n-InP layer 102. Iron-doped InP burying layers 104 and 106 are located to the sides of QC active region 108. Ideally, iron-doped InP burying layers are perfectly insulating to force the drive current to flow from top electrode 105 to bottom electrode 110 or vice versa through QC active region 108. However, the iron doped InP material exhibits a thermally activated conductivity so that iron-doped InP burying layers 104 and 106 become conductive at elevated temperatures above about 50° C. Therefore, under conditions where the current causes heating to greater than about 50° C., the drive current may be partially shunted through iron-doped InP burying layers 104 and 106 avoiding QC active region 108 and degrading laser performance.

BRIEF SUMMARY OF INVENTION

In accordance with the invention, p-type InP non-insulating burying layers may be used to make deep buried heterostructure (BH) waveguides for InGaAs—AlInAs based QC lasers. Doped non-insulating burying layers typically allow current blocking at temperatures above about 50° C. that occur during continuous wave operation because of the presence of a reverse biased p-n or n-p junction.

P or n-type non-insulating burying layers may also be used for AlGaAs or GaAlSb—InAs based QC lasers. For AlGaAs based QC lasers, the non-insulating burying layers would typically be p-type GaAs or AlGaAs whereas for GaAlSb—InAs based QC lasers the non-insulating burying layers would typically be GaSb or AlGaAsSb. The dopant type is selected to have the opposite polarity of the QC laser.

DETAILED DESCRIPTION

Figure 1:
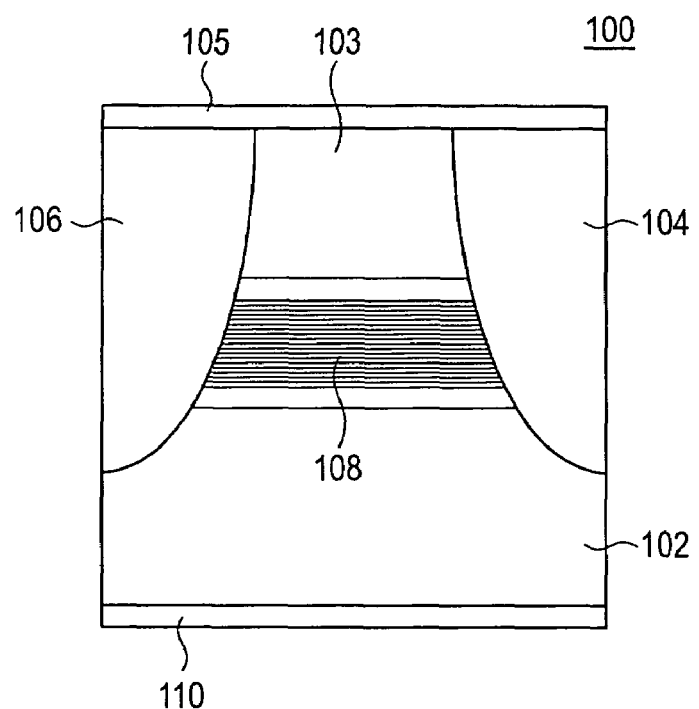
FIG. 1 shows a prior art buried heterostructure.
Figure 2:
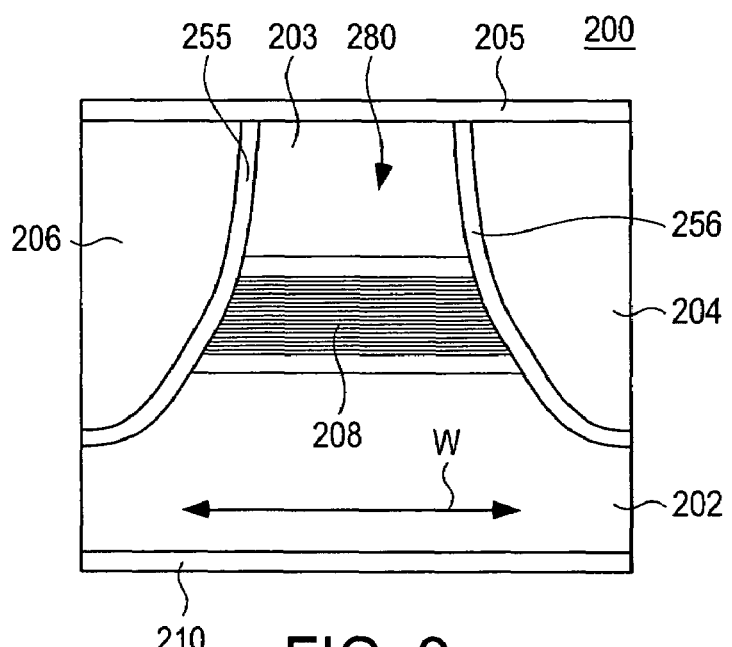
FIG. 2 shows an embodiment in accordance with the invention.

FIG. 2 shows an embodiment in accordance with the invention. Quantum cascade laser (QCL) structure 200 has top electrode 205 and bottom electrode 210 sandwiching n-InP layer 203 and n-InP layer 202. Quantum cascade (QC) active region 208 is located between n-InP layer 203 and n-InP layer 202. P-type InP non-insulating burying layers 204 and 206 are located to the sides of QC laser active region 208. P-type InP non-insulating burying layers 204 and 206 frame n-InP layer 203, part of n-InP layer 202 and QC laser active region to define ridge structure 280. Examples of p-type InP non-insulating burying layers 204 and 206 are InP:Zn or InP:Mg non-insulating burying layers. P-type InP non-insulating burying layers 204 and 206 typically provide good current blocking at temperatures above about 50° C. because of the current blocking characteristics offered by a reverse biased p-n junction. The presence of free holes in p-type InP non-insulating burying layers 204 and 206 contributes a free-carrier absorption loss to the guided mode. The modal loss can typically be adjusted by changing the waveguide width and the p-type doping in InP non-insulating burying layers 204 and 206, allowing stable single-mode operation. In particular, the doping and ridge width, w, may be adjusted to provide strong modal discrimination so that the fundamental lateral mode has little additional loss and higher order modes are effectively filtered because they experience far more loss than the fundamental lateral mode. Typical doping concentrations that are required in accordance with the invention are in the range from about $10^{17}$-$10^{18}$ cm$^{-3}$.

The structure shown in FIG. 2 is typically not applicable to conventional buried heterostructure diode lasers. Because diode lasers are bipolar devices, an n-p-n blocking structure is required. Furthermore, the thickness of the buried doped layers along with their position and alignment with ridge region 280 typically need to be carefully controlled in a conventional buried heterostructure laser diode. However, for unipolar QC lasers, InP non-insulating burying layers 204 and 206 have a polarity opposite to QC active region 208 and provide effective current blocking.

The modal loss associated with doped non-insulating burying layers 204 and 206 for quantum cascade laser structure 200 can be quantified using waveguide simulations that incorporate the Drude model for the dielectric function of doped semiconductors. For example, at a wavelength of 10 µm, the calculated doping dependence of the real part of the complex refractive index for p-type InP is shown by curve 310 in FIG. 3.

Figure 3:
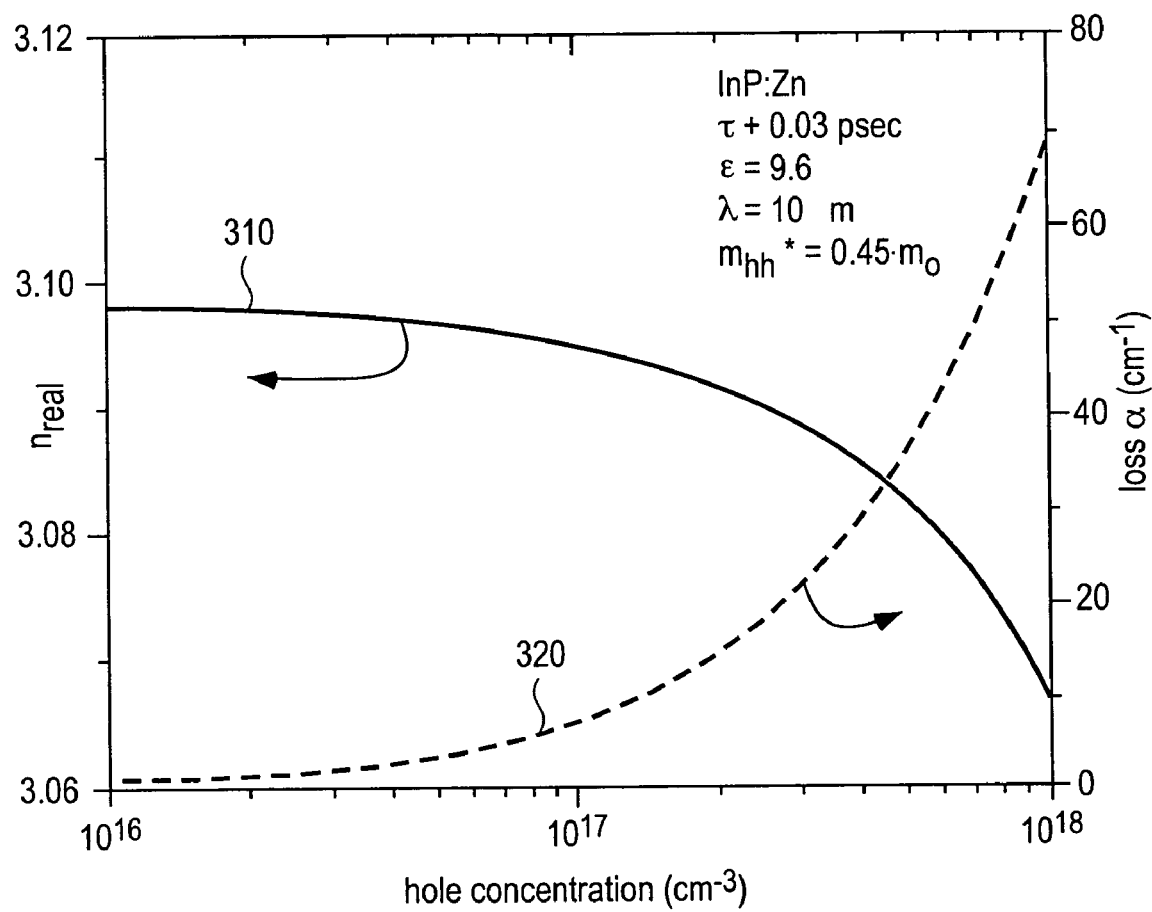
FIG. 3 shows hole concentration versus loss and versus the real part of the complex refractive index for an embodiment in accordance with the invention.

The calculated absorption is shown by curve 320 in FIG. 3 and is proportional to the imaginary part of the refractive index. For the calculations in FIG. 3, an effective hole mass of $m_h$~0.45 $m_0$, a dielectric constant of $\epsilon_\infty$~9.6, a wavelength of $\lambda$~10 µm and a scattering time of $\tau$~0.03 psec are assumed. At the long wavelength of $\lambda$~10 µm typically associated with QC lasers, the absorption loss becomes large even at moderate doping levels in the $10^{17}$ cm$^{-3}$ range. Typically, the absorption loss increases more rapidly than shown by calculated curve 320 in FIG. 3 because the scattering time decreases for high doping levels. Including the decrease in scattering time from $\tau$~0.03 psec to $\tau$~0.024 psec into account in the calculations shows that for a p doping level of about $1\times10^{18}$ cm$^{-3}$ the absorption is increased from about 70 cm$^{-1}$ to 86 cm$^{-1}$.

Figure 4:
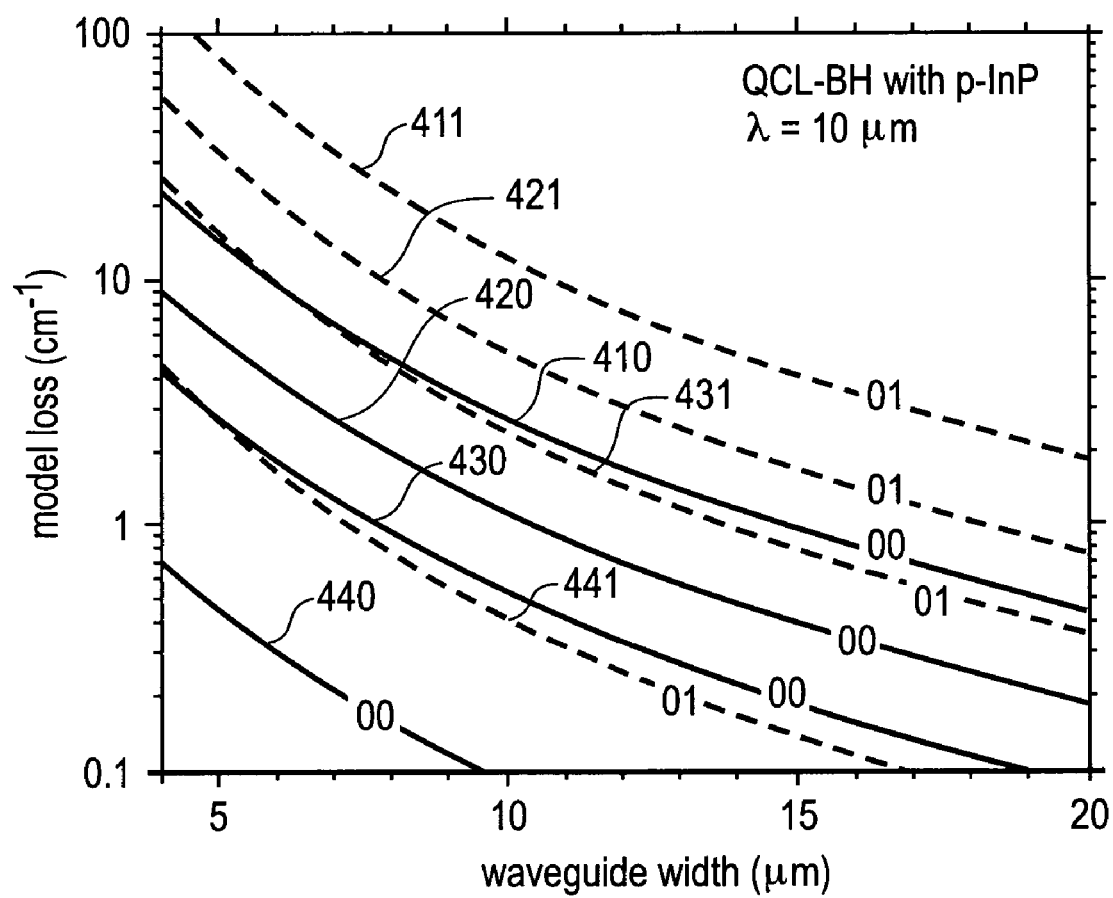
FIG. 4 shows waveguide width versus mode loss for embodiments in accordance with the invention.

FIG. 4 shows the modal loss for a 10 µm wavelength, buried heterostructure QCL with p-type non-insulating burying layers in accordance with the invention as a function of the waveguide width, w. The effective refractive index of the transverse mode in ridge region 280 is taken as 3.4. Curve 410 shows the modal loss for the fundamental mode and Curve 411 shows the modal loss for the first higher mode at a p-type doping level of about $2\times10^{18}$ cm$^{-3}$. Curve 420 shows the modal loss for the fundamental mode and Curve 421 shows the modal loss for the first higher mode at a p-type doping level of about $1 \times 10^{18}$ cm$^{-3}$. Curve 430 shows the modal loss for the fundamental mode and Curve 431 shows the modal loss for the first higher mode at a p-type doping level of about $5 \times 10^{17}$ cm$^{-3}$. Curve 440 shows the modal loss for the fundamental mode and Curve 441 shows the modal loss for the first higher mode at a p-type doping level of about $1 \times 10^{17}$ cm$^{-3}$.

Figure 5:
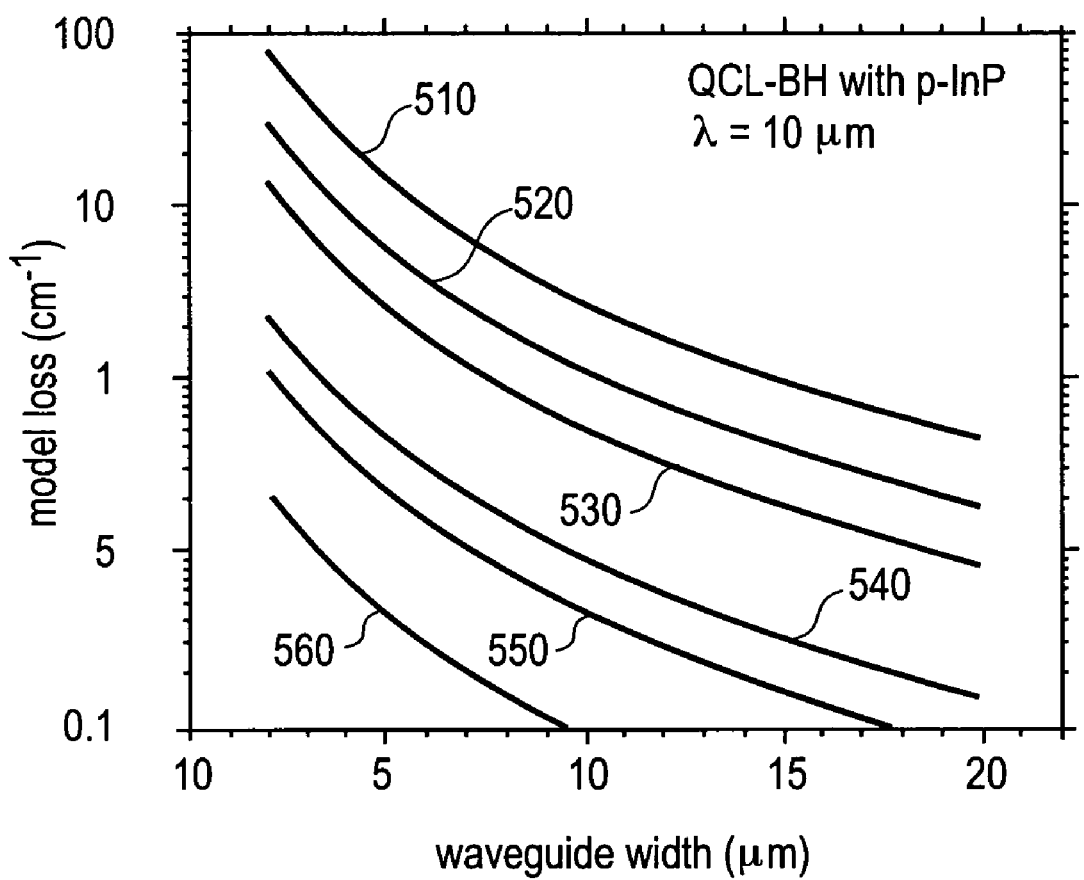
FIG. 5 shows waveguide width versus the fundamental mode loss for embodiments in accordance with the invention.

FIG. 5 shows the fundamental mode loss as a function of waveguide width, w, for different p-type doping levels. Curve 510 shows the fundamental mode loss for a p-type doping level of about $2 \times 10^{18}$ cm$^{-3}$. Curve 520 shows the fundamental mode loss for a p-type doping level of about $1 \times 10^{18}$ cm$^{-3}$. Curve 530 shows the fundamental mode loss for a p-type doping level of about $5 \times 10^{17}$ cm$^{-3}$. Curve 540 shows the fundamental mode loss for a p-type doping level of about $1 \times 10^{17}$ cm$^{-3}$. Curve 550 shows the fundamental mode loss for a p-type doping level of about $5 \times 10^{16}$ cm$^{-3}$. Curve 560 shows the fundamental mode loss for a p-type doping level of about $1 \times 10^{16}$ cm$^{-3}$.

The calculations in FIG. 4 show that the p-type doping levels may be adjusted in accordance with the invention to make the modal loss in the fundamental mode acceptably low. For example, taking a waveguide width of about 10 μm and a p-type doping level of about $5 \times 10^{17}$ cm$^{-3}$ results in a fundamental mode loss of about 1 cm$^{-1}$ while the first higher mode loss is about 5 cm$^{-1}$. Narrow ridge regions provide better lateral heat dissipation because the InP heat-conductor is closer to the center of ridge region 280 and lower absolute threshold current because the smaller volume of the narrow ridge region requires less pumping. For narrow waveguides, the mode extends further into p-InP non-insulating burying layers 206 and 204 so the p-type doping is typically reduced to lower the fundamental mode loss. FIGS. 4 and 5 show that the mode loss is greater for narrow ridge regions. The greater loss occurs because a portion of the mode extends outside ridge region 280 and into InP non-insulating burying layers 206 and 204. FIGS. 4 and 5 also show that the mode loss decreases with the p-doping concentration in InP non-insulating burying layers 206 and 204. Therefore, to achieve low loss with a narrow ridge requires that the doping concentration be lowered. However, from FIG. 4 it is apparent that typically p-type doping in the range from about $10^{17}$ cm$^{-3}$ to about $10^{18}$ cm$^{-3}$ results in acceptably low fundamental mode loss and good mode discrimination. Doping in the range from about $10^{17}$ cm$^{-3}$ to about $10^{18}$ cm$^{-3}$ is typically easily controlled and produces an effective current blocking junction in accordance with the invention.

In accordance with the invention, if the objective is low waveguide loss and mode discrimination is not critical, p-type doping in non-insulating burying layers 204 and 206 can typically be on the order of about $10^{16}$ cm$^{-3}$. This typically results in less than about 1 cm$^{-1}$ additional modal loss even for narrow waveguides having a width, w, on the order of about 2 μm-about 3 μm. It can be seen that p-type non-insulating burying layers 204 and 206 typically contribute small losses (see FIG. 5) while providing effective current blocking.

In accordance with the invention, the large reverse bias in the range from about 5 V to about 10 V typically used with QC lasers creates depletion regions 255 and 256 along the sidewalls of the buried ridge. For example, a p-type doping level of about $5 \times 10^{16}$ cm$^{-3}$ in non-insulating burying layers 204 and 206 along with a bias voltage of about 5 V typically creates a depletion width of 0.35 μm in the p-region and 0.1 μm in the n-region assuming n-type doping in the n-region is about $2 \times 10^{17}$ cm$^{-3}$. Depletion regions 255 and 256 further reduce waveguide absorption loss because the hole concentration which gives rise to free-carrier loss is lowered by depletion. Absorption loss for narrow width buried ridge waveguides is particularly reduced because the mode has greater overlap with p-InP non-insulating burying layers 204 and 206. Similarly, the depletion region functions to keep electrons away from the sidewalls of the buried ridge that may have a high surface state density due to, for example, etching damage, oxidation or imperfect overgrowth. Because of the high surface state density, zinc diffusion is enhanced and electrons are displaced from the regrowth interfaces where depletion regions 255 and 256 arise. Hence, p-doped blocking layers may be used for lowering the threshold voltage, enhancing reliability and high-injection capability because carriers are depleted from the potentially defective regrowth interfaces.

The p-type doped non-insulating burying layers 204 and 206 may be applied to buried heterostructure QC lasers fabricated from materials such as, for example, AlGaAs or AlGaSb—InAs. For AlGaAs based QC lasers, the non-insulating burying layers would typically be p-type GaAs or AlGaAs whereas for GaAlSb—InAs based QC lasers the non-insulating burying layers would typically be GaSb or AlGaAsSb. The dopant type is selected to have the opposite polarity of the QC laser. A QC laser based on electron transitions requires p-type non-insulating burying layers while a QC laser involving valence-band transitions requires n-type non-insulating burying layers. This allows the non-insulating burying layers form a blocking junction. Furthermore, analogous non-insulating burying layers may be used with QC lasers with p-type active regions where the non-insulating burying layers are n-type doped. The loss associated with n-type doping is typically lower than for p-type doping so that higher carrier concentrations are typically tolerated for n-type doping.

The invention claimed is:

1. A unipolar quantum cascade laser structure comprising: a ridge region; and a pair of doped non-insulating burying layers framing said ridge region, said pair of doped non-insulating burying layers being non-insulating at room temperature.

2. The structure of claim 1 wherein said ridge region comprises a semiconductor layer.

3. The structure of claim 2 wherein said semiconductor layer is n-doped.

4. The structure of claim 1 wherein said pair of doped non-insulating burying layers are p-doped.

5. The structure of claim 4 wherein said pair of doped non-insulating burying layers are p-doped using a dopant selected from the group consisting of Zn and Mg.

6. The structure of claim 4 wherein a doping level is in the range from $10^{16}$ cm$^{-3}$ to about $10^{18}$ cm$^{-3}$.

7. The structure of claim 1 having an operating wavelength on the order of about 10 μm.

8. The structure of claim 1 wherein said pair of doped non-insulating burying layers comprise a material selected from the group consisting of GaSb, AlGaAsSb, GaAs, and AlGaAs.

9. A unipolar quantum cascade laser structure comprising:
 an active region;
 a pair of semiconductor layers sandwiching said active region; and
 a pair of doped non-insulating burying layers framing at least one of said pair of semiconductor layers, said pair of doped non-insulating burying layers being non-insulating at room temperature.

10. The structure of claim 9 wherein said pair of semiconductor layers is n-doped.

11. The structure of claim 9 wherein said pair of doped non-insulating burying layers are p-doped.

12. The structure of claim 11 wherein said pair of doped non-insulating burying layers are p-doped using a dopant selected from the group consisting of Zn and Mg.

13. The structure of claim 11 wherein a doping level is in the range from about $10^{16}$ cm$^{-3}$ to about $10^{18}$ cm$^{-3}$.

14. The structure of claim 9 wherein said pair of doped non-insulating burying layers comprise a material selected from the group consisting of GaSb, AlGaAsSb, GaAs, and AlGaAs.

15. A method for making a unipolar quantum cascade laser structure comprising:
providing an active region;
sandwiching said active region with a pair of semiconductor layers; and
providing a pair of doped non-insulating burying layers to frame at least one of said pair of semiconductor layers, said pair of doped non-insulating burying layers being non-insulating at room temperature.

16. The method of claim 15 wherein said pair of semiconductor layers is n-doped.

17. The method of claim 15 wherein said pair of doped non-insulating burying layers are p-doped.

18. The method of claim 17 wherein said pair of doped non-insulating burying layers are p-doped using a dopant selected from the group consisting of Zn and Mg.

19. The method of claim 17 wherein a doping level is in the range from about $10^{16}$ cm$^{-3}$ to about $10^{18}$ cm$^{-3}$.

20. The method of claim 15 wherein said pair of doped non-insulating burying layers comprise a material selected from the group consisting of GaSb, AlGaAsSb, GaAs, and AlGaAs.

* * * * *

UNITED STATES PATENT AND TRADEMARK OFFICE
CERTIFICATE OF CORRECTION

PATENT NO.       : 7,274,719 B2
APPLICATION NO.  : 11/076599
DATED            : September 25, 2007
INVENTOR(S)      : Bour et al.

It is certified that error appears in the above-identified patent and that said Letters Patent is hereby corrected as shown below:

In column 4, line 53, in Claim 6, after "from" insert -- about --.

Signed and Sealed this

Thirteenth Day of May, 2008

JON W. DUDAS
*Director of the United States Patent and Trademark Office*